(12) United States Patent
Pasadyn et al.

(10) Patent No.: US 6,442,496 B1
(45) Date of Patent: Aug. 27, 2002

(54) METHOD AND APPARATUS FOR DYNAMIC SAMPLING OF A PRODUCTION LINE

(75) Inventors: Alexander J. Pasadyn; Anthony J. Toprac, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 115 days.

(21) Appl. No.: 09/633,930

(22) Filed: Aug. 8, 2000

(51) Int. Cl.[7] .......................... H01L 21/00; G06F 19/00
(52) U.S. Cl. .............................. 702/83; 702/82; 702/84; 438/7; 438/8
(58) Field of Search .............................. 702/81, 82, 83, 702/84, 182; 700/95, 110, 116–117, 121; 438/5, 7–8, 14

(56) References Cited

U.S. PATENT DOCUMENTS 6,245,581 B1 * 6/2001 Bonser et al. ................. 438/8
6,248,602 B1 * 6/2001 Bode et al. ................... 438/14
6,337,217 B1 * 1/2002 Hause et al. ................... 438/7

* cited by examiner

*Primary Examiner*—Bryan Bui
(74) *Attorney, Agent, or Firm*—Williams, Morgan & Amerson, P.C.

(57) ABSTRACT

The present invention provides for a method and an apparatus for performing dynamic sampling of a production line. A first plurality of semiconductor wafers are processed. A minimum sampling rate of semiconductor wafers is calculated. Wafers from the first plurality of the semiconductor wafers are selected and analyzed at the calculated sampling rate. The performance of the processing of the first plurality of semiconductor wafers is quantified, based upon the analyzed wafers. A dynamic sampling process is performed based upon the quantification of the performance of the processing of semiconductor wafers.

38 Claims, 6 Drawing Sheets

METHOD AND APPARATUS FOR DYNAMIC SAMPLING OF A PRODUCTION LINE

BACKGROUND OF THE INVENTION

1. Field of the Invention

This invention relates generally to semiconductor manufacturing, and, more particularly, to a method and apparatus for performing dynamic sampling of semiconductor wafers in a production line.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and, therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the factors that affect semiconductor device manufacturing are wafer-to-wafer variations that are caused by manufacturing problems that include effects of manufacturing machine tool variations, memory effects of manufacturing chambers, first-wafer effects, and the like. Among the process steps that are adversely affected by such factors are photolithography overlay processes, etching processes, and rapid thermal anneal (RTA) processes. Overlay is one of several important steps in the photolithography area of semiconductor manufacturing. Overlay control involves measuring the misalignment between two successive patterned layers on the surface of a semiconductor device. Generally, minimizing misalignment errors helps to ensure that the multiple layers of the semiconductor devices are connected and functional. As technology facilitates smaller critical dimensions for semiconductor devices, the need for reducing misalignment errors increases dramatically.

Generally, photolithography engineers currently analyze the overlay errors a few times a month. The results from the analysis of the overlay errors are used to make updates to exposure tool settings manually. Some of the problems associated with the current methods include the fact that the exposure tool settings are only updated a few times a month. Furthermore, currently, the exposure tool updates are commonly performed manually.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes are required, improved methods are needed to revise input parameters that control manufacturing processes in a more automated and timely manner. Furthermore, wafer-to-wafer manufacturing variations can cause non-uniform quality of semiconductor devices.

In order to perform corrections to the manufacturing processes, such as revising the input parameters that control the manufacturing processes, manufacturing or production data is acquired. Generally, manufacturing data is acquired using a variety of production data acquisition tools, such as metrology tools. One problem associated with acquiring production data is that manufacturing costs increase without a substantial contribution to the actual production process itself.

A known technique for evaluating the acceptability of the semiconductor manufacturing processes, particularly in photolithography processes, involves measuring critical dimensions and other parameters after the photoresist has been developed. One method used to evaluate the developed wafer is to use scatterometry to generate an intensity measurement indicative of the pattern on the wafer. Other production data acquisition methods, such as measuring critical dimensions and the like, can be employed to acquire production data and make adjustments to manufacturing processes. Currently, the industry lacks an efficient means for acquiring production data to make adjustments to production processes in a cost-effective manner.

The present invention is directed to overcoming, or at least reducing the effects of, one or more of the problems set forth above.

SUMMARY OF THE INVENTION

In one aspect of the present invention, a method is provided for performing dynamic sampling of a production line. A first plurality of semiconductor wafers are processed. A minimum sampling rate of semiconductor wafers is calculated. Wafers from the first plurality of semiconductor wafers are selected and analyzed at the calculated sampling rate. The performance of the processing of the first plurality of semiconductor wafers is quantified, based upon the analyzed wafers. A dynamic sampling process is performed based upon the quantification of the performance of the processing of semiconductor wafers.

In another aspect of the present invention, an apparatus is provided for performing dynamic sampling of a production line. The apparatus of the present invention comprises: a computer system; a manufacturing model coupled with said computer system, said manufacturing model being capable of generating and modifying at least one control input parameter signal; a machine interface coupled with said manufacturing model, said machine interface being capable of receiving process recipes from said manufacturing model; a processing tool capable of processing semiconductor wafers and coupled with said machine interface, said first processing tool being capable of receiving at least one control input parameter signal from said machine interface; a metrology tool coupled with said first processing tool and said second processing tool, said metrology tool being capable of acquiring metrology data; a metrology data processing unit coupled with said metrology, said metrology data processing unit being capable of organizing said acquired metrology data; and a sample rate adjustment unit coupled with said computer system, said sample rate adjustment unit being capable of determining a sampling rate for selecting and sampling processed semiconductor wafers based upon said organized metrology data.

BRIEF DESCRIPTION OF THE DRAWINGS

The invention may be understood by reference to the following description taken in conjunction with the accompanying drawings, in which like reference numerals identify like elements, and in which.

Figure 1:
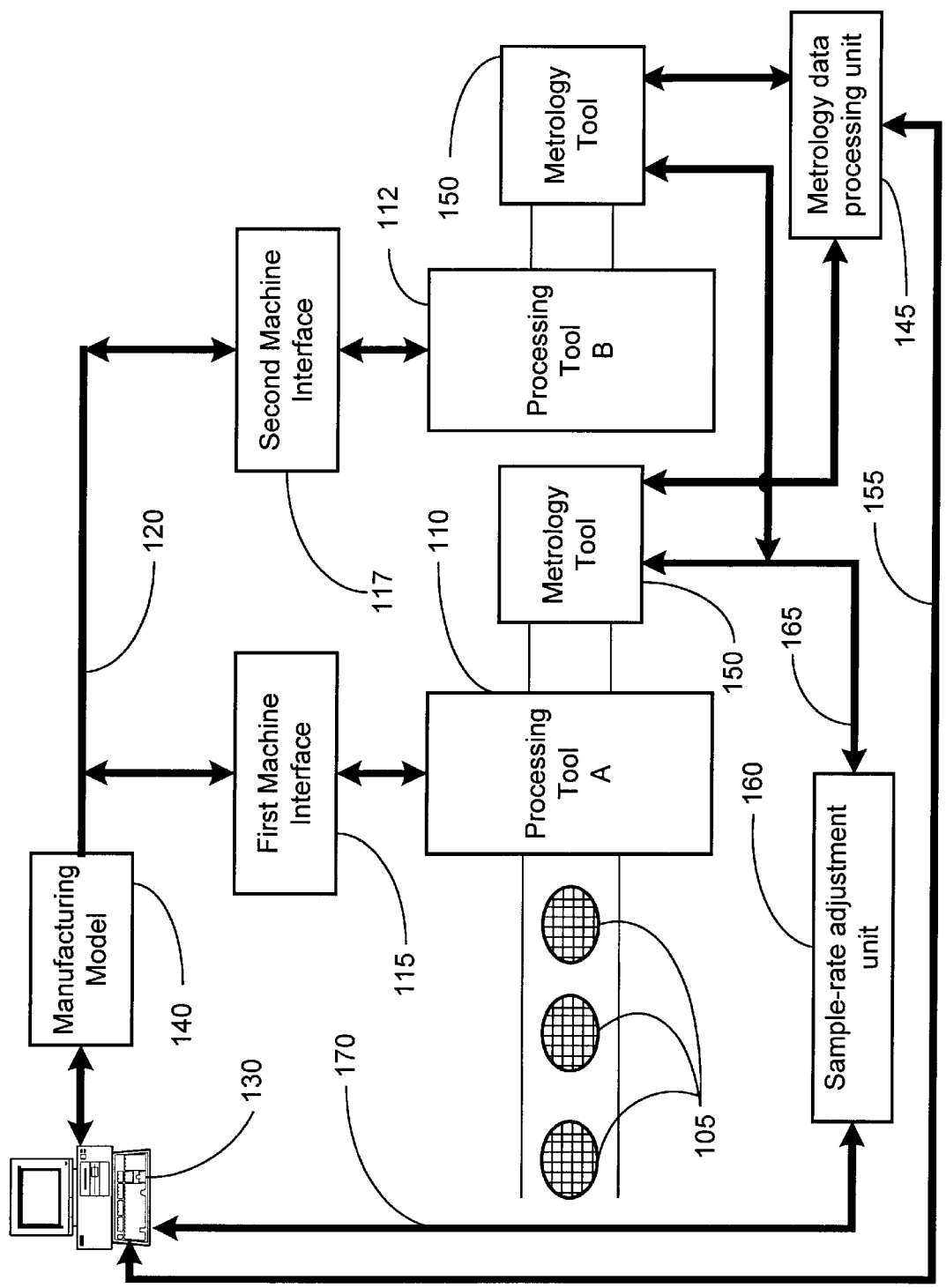
FIG. 1 illustrates one embodiment of the method taught by the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Wafer-to-wafer variations can result in an output of non-uniform semiconductor devices. Although one or more concepts taught by the present invention are described in the context of photolithography processes, it is understood that those skilled in the art can implement the present invention in a variety of semiconductor processing steps.

One process that is affected by non-uniformity of semiconductor wafers during semiconductor manufacturing steps is the photolithography overlay process. The overlay process is an important step in semiconductor manufacturing. In particular, the overlay process involves measuring misalignment errors between semiconductor layers during manufacturing processes. Improvements in the overlay process could result in substantial enhancements, in terms of quality and efficiency, in semiconductor manufacturing processes. The present invention provides a method and an apparatus for efficiently acquiring production data by sampling certain semiconductor wafers during production and adjusting the sampling rate of wafer production data acquisition during production of semiconductor wafers.

Semiconductor devices are processed in a manufacturing environment using a number of input control parameters. Turning now to FIG. 1, one embodiment of the present invention is illustrated. In one embodiment, semiconductor products 105, such as semiconductor wafers, are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. In one embodiment, the manufacturing model 140 contains a recipe that determines a plurality of control input parameters that are sent on the line 120.

In one embodiment, the manufacturing model 140 defines a process script and input control that implement a particular manufacturing process. The control input signals on the line 120 that are intended for processing tool A 110 are received and processed by the first machine interface 115. The control input signals on the line 120 that are intended for processing tool B 112 are received and processed by the second machine interface 117. Examples of the processing tools 110, 112 used in semiconductor manufacturing processes are steppers, scanners, step-and-scan tools, and etch process tools. In one embodiment, processing tool A 110 and processing tool B 112 are photolithography process tools, such as steppers.

One or more of the semiconductor wafers that are processed by the processing tools 110, 112 are generally sent to a metrology tool 150 for acquisition of production data or metrology data. In one embodiment, the metrology tool 150 is a scatterometry data acquisition tool, or a scatterometer. Data from the metrology tool 150 is processed and organized by the metrology data processing unit 145. In one embodiment, the metrology data processing unit 145 correlates the metrology data to a particular manufacturing lot of processed semiconductor wafers. The metrology data processing unit 145 sends metrology data to the computer system 130 via a line 155. In one embodiment, the metrology data processing unit 145 is integrated into the computer system 130. In one embodiment, the metrology data processing unit 145 is a computer software program embedded into the computer system 130, wherein the computer system 130 is integrated within the APC framework.

The computer system 130 analyzes the metrology data and performs process adjustments in response to the metrology data. In one embodiment, only a subset of the semiconductor wafers that are being processed is sent to the metrology tool 150 for production data acquisition. Acquiring metrology data for all of the semiconductor wafers being processed can be inefficient and cost-prohibitive. Therefore, a predetermined sample rate is used to sample a fraction of the semiconductor wafers being processed. In general, as confidence in the accuracy of the manufacturing process is high, the sampling rate for production data acquisition is set relatively low. As confidence in the accuracy of the manufacturing process is low, the sampling rate for production data acquisition is set relatively high in order to make more fine-tuned adjustments to the manufacturing process. Using the methods taught by the present invention, the computer system 130 adjusts the sample rate, through the sample-rate adjustment unit 160, to improve the semiconductor manufacturing process. The sample-rate adjustment unit 160 is interfaced with the metrology tool 150 via a line 165. In one embodiment, the sample-rate adjustment unit 160 is integrated into the computer system 130. In an alternative embodiment, the sample-rate adjustment unit 160 is a standalone unit.

In the context of a manufacturing process, such as a stepper process, the control inputs on the line 120 that are used to operate the processing tool 110 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the features taught by the present invention is a method of updating control input signals on the line 120 in response to an analysis of production data.

When a process step in the processing tool 110 is concluded, the semiconductor product 105 that is being processed in the processing tool 110 is examined in a metrology tool 150, such as a review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs of a particular exposure process. The control inputs generally affect the accuracy of the process steps performed by the exposure tools on the semiconductor wafer. The control input signals affect the reticle magnification and the position of the semiconductor wafer that is being processed. Modifications of the control inputs can be utilized to improve the performance of the process steps employed in the exposure tool. In one embodiment, modifications to the control input signals on the line 120 are based upon the effects of external variables on the semiconductor devices being processed.

Figure 2:
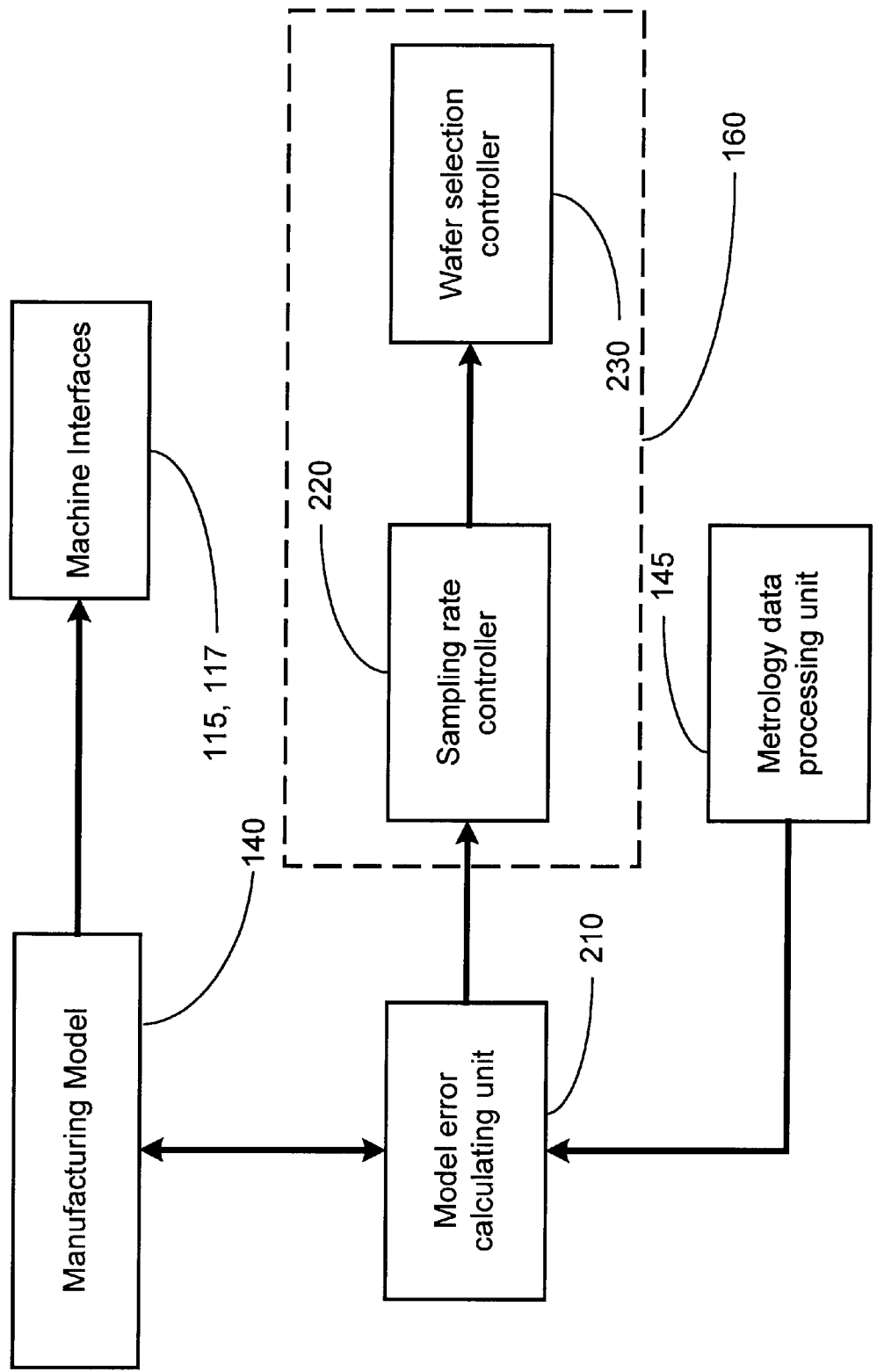
FIG. 2 illustrates a more detailed diagram of one embodiment of the apparatus for implementing the present invention.

Turning now to FIG. 2, a more detailed diagram of one embodiment of the apparatus for implementing the present invention is illustrated. FIG. 2 illustrates the manufacturing model 140, the machine interfaces 115, 117, a model error calculating unit 210, the metrology data processing unit 145, and the sampling-rate adjustment unit 160. In one embodiment, the sampling-rate adjustment unit 160 comprises a sampling rate controller 220, and a wafer selection controller 230. In one embodiment, the metrology data processing unit 145 acquires metrology data from the metrology tool 150 and sends the processed metrology data to the model error calculating unit 210.

In one embodiment, model error corresponds to the amount of deviation detected in the manufactured semiconductor wafers as compared to the expected results based upon the manufacturing model 140. The model error calculating unit 210 calculates the amount of modifications that are to made to the control input parameters on the line 120 in order to compensate for manufacturing inaccuracies. In one embodiment the model error calculating unit 210 is integrated into the computer system 130.

The model error data is sent to the manufacturing model 140, which performs modifications to the control input parameters on the line 120 and sends them to the machine interfaces 115, 117. As described above, the machine interfaces 115, 117 send the newly modified control input parameters to the processing tools 110, 112 for further processing of semiconductor wafers.

Data from the model error calculating unit 210 is used to determine the sampling rate of the semiconductor wafers being sampled from the production line (not shown). The model error data from the model error calculating unit 210 is sent to the sampling rate controller 220 in the sampling-rate adjustment unit 160. In one embodiment, the sampling rate controller 220 determines the sampling rate for metrology data acquisition based upon the amount of model error. In general, as the amount of the model errors increases, the sampling rate controller 220 sets the sampling rate at a greater frequency. Conversely, the lower the amount of the model errors, the lower the sampling rate. The relationship between the model error and the sampling rate described above follows the principle that when model error is high, the accuracy of the manufacturing processes is low. Therefore, a higher sampling rate for examining semiconductor wafers is desirable since a higher sampling rate will yield a more precise set of production data (or a set of metrology data). A high sampling rate generally results in production data that more accurately reflects the actual results of the manufacturing process. When the accuracy of the production data is more reflective of the actual manufacturing process results, calculations of the model errors that are used to modify control input parameters on the line 120 become more precise.

Using the model error data, the sampling rate controller 220 determines an appropriate sampling rate and sends the sampling rate data to the wafer selection controller 230. In one embodiment, the wafer selection controller 230 oversees the selection of particular semiconductor wafers as they progress through the production line. The number of semiconductor wafers that are sampled for production data acquisition is directly proportional to the sampling rate. When production data that is more representative of the actual production data is required, the sampling rate controller 220 prompts the wafer selection controller 230 to select a higher number of semiconductor wafers for analysis in the metrology tool 150.

Figure 3:
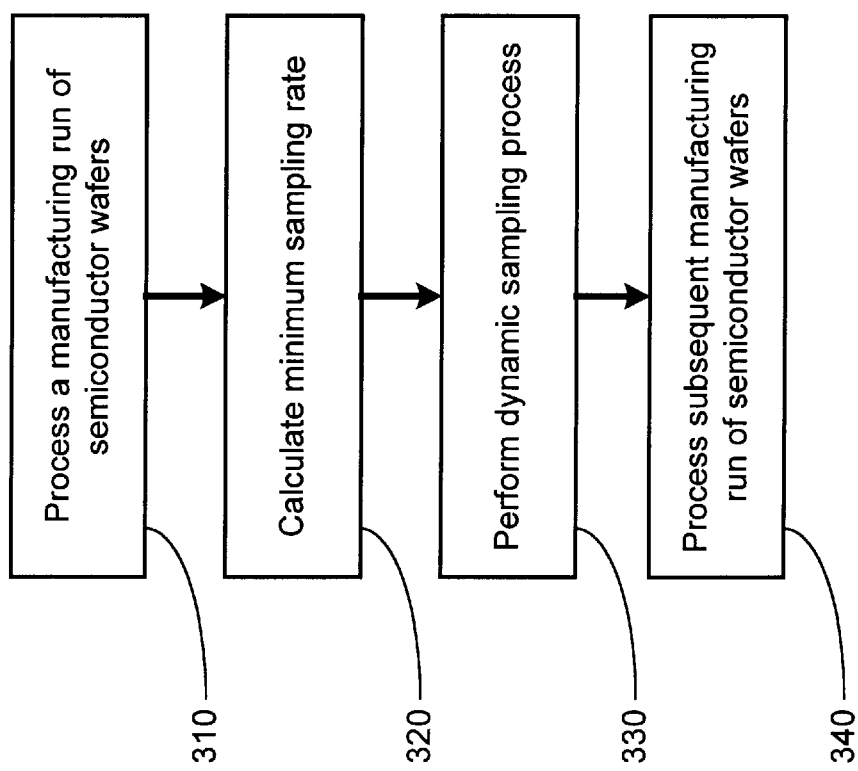
FIG. 3 illustrates a flowchart representation of the methods taught by the present invention.

Turning now to FIG. 3, a flowchart representation of one method of implementing the teachings of the present invention is illustrated. A manufacturing run of semiconductor wafers is processed, as described in block 310 of FIG. 3. A minimum sampling rate for sampling production semiconductor wafers and acquiring production data is determined, as described in block 320 of FIG. 3. In one embodiment, historical production data is used to track performance of similar manufacturing processes as well as the quality of the semiconductor wafers netted from such manufacturing processes. Generally, a 100 percent sampling of production semiconductor wafers is inefficient since representative production data can be acquired at a lower sampling rate. A historical minimum model error is determined using calculations known by those skilled in the art. A determination is made regarding the minimum sampling rate that results in production data that can be used to determine if the actual production errors are within a minimum acceptable model error as determined by those skilled in the art.

Figure 4:
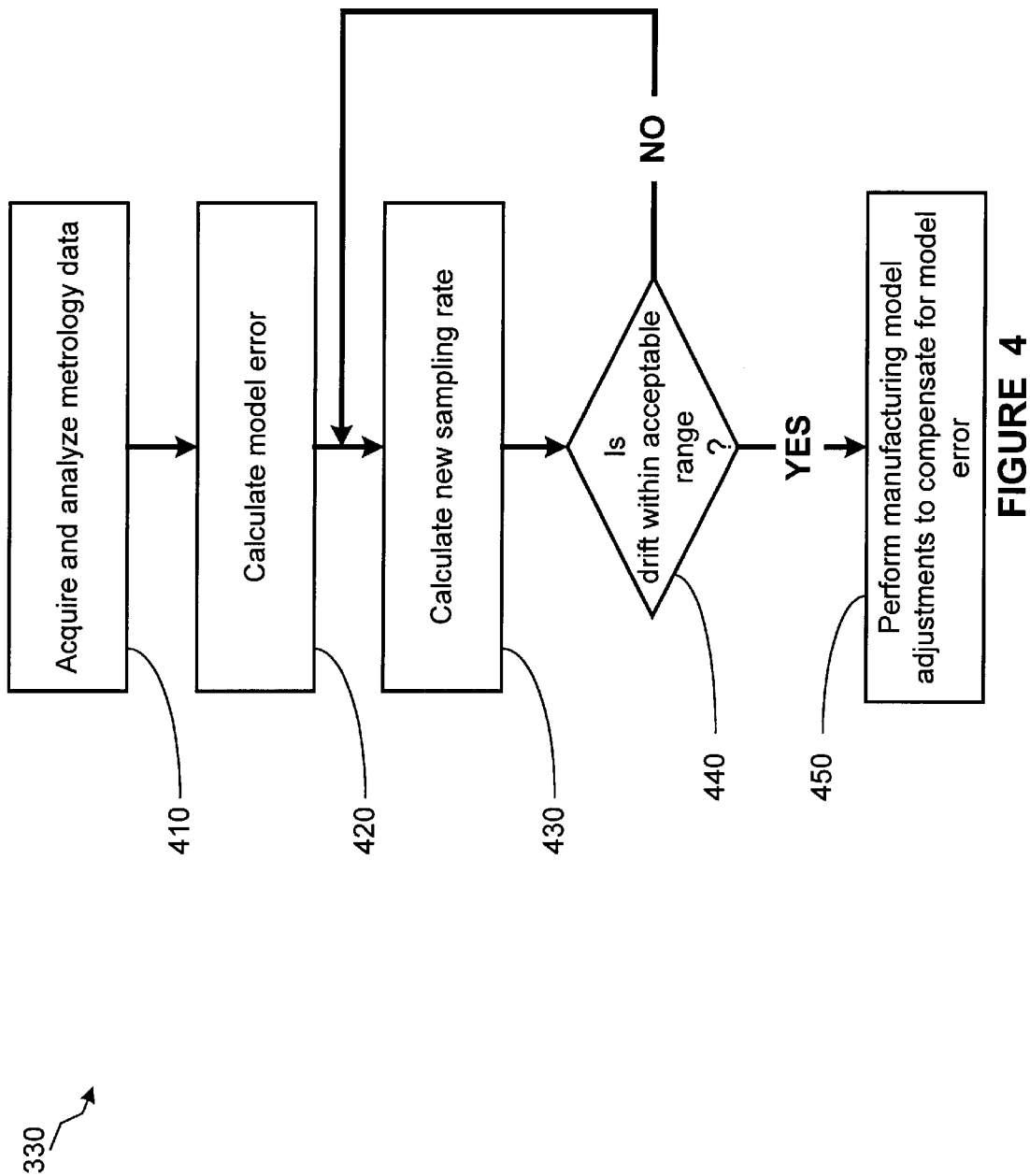
FIG. 4 illustrates a more detailed flowchart representation of the step of performing a dynamic sampling process described in FIG. 3.

Once the minimum sampling rate is calculated, a dynamic sampling process is performed, as described in block 330 of FIG. 3. The dynamic sampling process relates to a process that is capable of modifying the sampling rate in order to maintain the acquisition of production data at a rate that is a fair representation of the actual production data. FIG. 4 illustrates a flowchart representation of a more detailed illustration of the step of performing the dynamic sampling process described in block 330 of FIG. 3.

Turning now to FIG. 4, once the minimum sampling rate is determined, metrology data is acquired for production semiconductor wafers that are sampled using the minimum sampling rate, and the acquired metrology data is analyzed, as described in block 410. Acquiring and analyzing metrology data comprises using a metrology tool 150 to perform metrology measurements upon sampled semiconductor wafers and using the metrology data processing unit 145 to correlate and store the metrology data. Once the metrology data is acquired and analyzed, the model error is calculated, as described in block 420 of FIG. 4. A flowchart representation of a more detailed illustration of the step of performing the calculation of the model error is depicted in FIG. 5.

Figure 5:
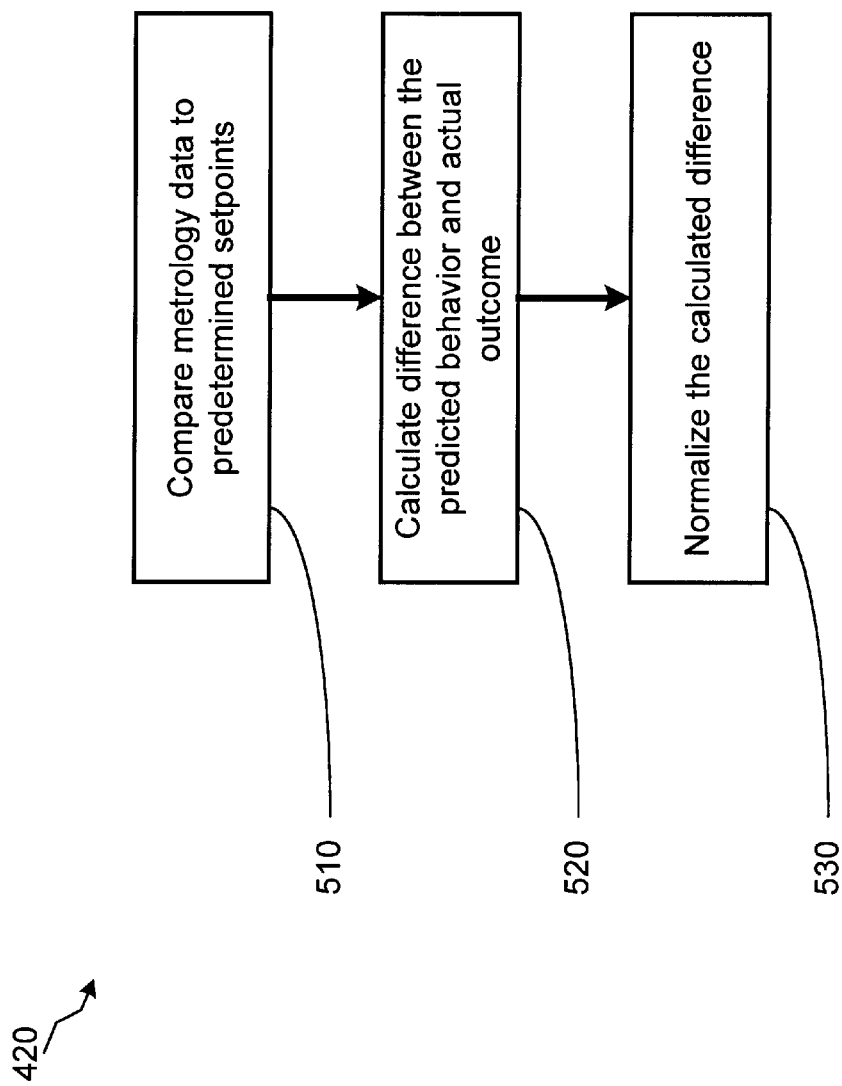
FIG. 5 illustrates a more detailed flowchart representation of the step of calculating model error described in FIG. 4.

Turning now to FIG. 5, the acquired metrology data is compared to predetermined setpoints, as illustrated in block 510 of FIG. 5. For example, data relating to the measured critical dimension on a particular layer of production semiconductor wafers is compared to a predetermined tolerance margin of the critical dimension, which can be determined by those skilled in the art. The data acquired from the comparison of the acquired metrology data to the predetermined setpoints is used to calculate the difference between the predicted behavior of the manufacturing process and the actual behavior of the manufacturing process. In other words, the discrepancies between the expected manufacturing results and the actual manufacturing results are quantified, which provides a calculated differential data, for further analysis.

Once the difference between the expected manufacturing result and the actual manufacturing result is quantified, the calculated differential data is normalized, as described in block 530 of FIG. 5. Normalizing the calculated differential data provides a method for viewing error differentials by their relative weight. In one embodiment, when a thickness of a particular deposition is tracked, the calculated differential data related to that thickness can be divided by a nominal thickness value that is predetermined by one skilled in the art. An alternative method of normalizing the calculated differential data is to divide the differential data by the number of semiconductor wafers that were processed. When the calculated differential data is normalized, the differential data may be expressed in terms of percentages, which can provide a more objective analysis of manufacturing performance across a variety of processing tools 110, 112. The normalized calculated differential data indicates the amount of model error, which completes the step of calculating the model error as described in block 420 of FIG. 4.

Turning back to FIG. 4, once the model error is calculated, a new sampling rate is determined in response to the model error, as described in block 430. When the model error is outside a predetermined range, the sampling rate is generally increased. When the model error is lower than the expected results, the sampling rate is generally decreased, which can result in greater manufacturing efficiency. The model error is generally charted as the semiconductor wafers progress through the manufacturing cycle. As described in block 440 of FIG. 4, a determination is made whether the charted model error is drifting outside a predetermined range, which can be calculated by those skilled in the art.

When a determination is made that the charted model error is not within the acceptable range, the sampling rate is generally increased as illustrated in FIG. 4. As an illustrative example, for a chemical mechanical polishing (CMP) process, a predetermined target thickness of the polished layer is set at 10,000 Å. The mean thickness of the sampled semiconductor wafers is expected to be within a small range around the predetermined value of 10,000 Å. When the mean thickness of the sampled semiconductor wafers falls outside the predetermined range, the sampling rate is generally increased. The increased sampling rate will generally indicate whether the error drift is due to the settings of the CMP process or whether the error drift is due to a random discrepancy in the manufacturing process.

Figure 6:
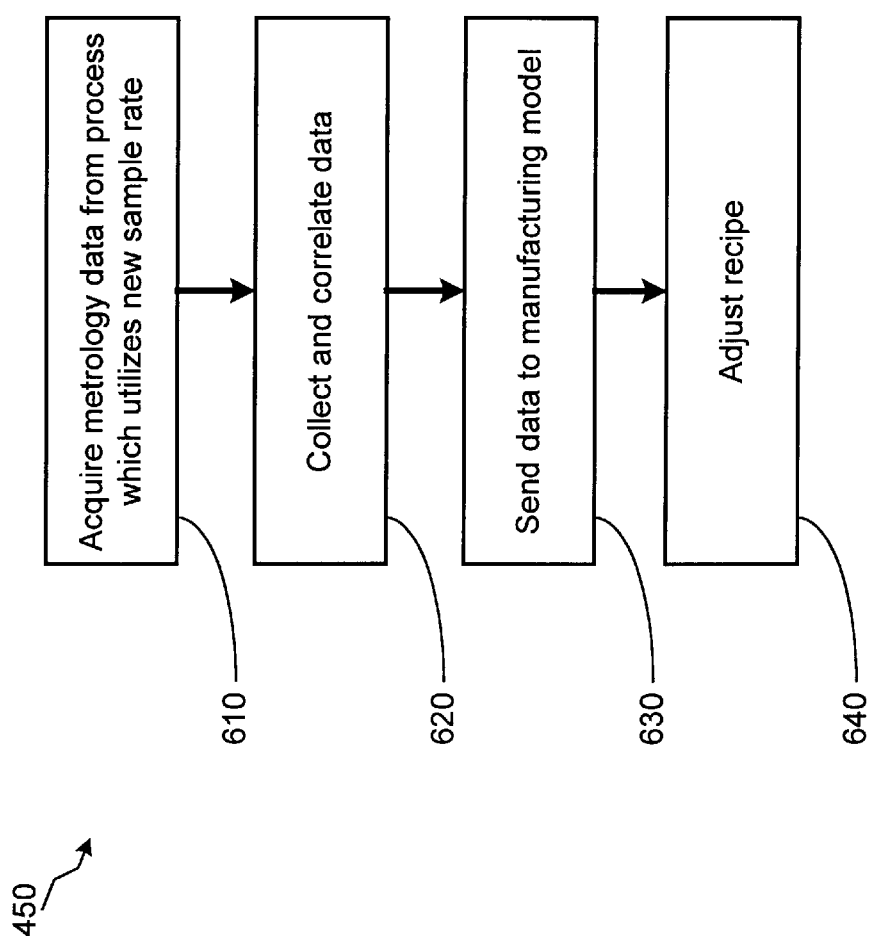
FIG. 6 illustrates a more detailed flowchart representation of the step of performing manufacturing model adjustments to compensate for model error described in FIG. 5.

When a determination is made that the charted model error is within the acceptable range, manufacturing model adjustments are performed to compensate for the model error, as described in block 450 of FIG. 4. FIG. 6 provides a more detailed flowchart illustration of the step of performing manufacturing model adjustments described in block 450 of FIG. 4.

Turning now to FIG. 6, metrology data from the manufacturing process that utilizes the newly calculated sampling rate is acquired, as described in block 610. The metrology data is acquired by sending the selected semiconductor wafers to the metrology tool 150 for metrology measurements. The metrology data is collected and correlated to specific manufacturing lots, data codes, and the like, by the metrology data processing unit 145, as described in block 620 of FIG. 6. The processed metrology data is sent to the manufacturing model 140 via the computer system 130, as described in block 630 of FIG. 6.

The computer system 130, in conjunction with the manufacturing model 140, performs adjustments to the process recipe, thereby modifying control input parameters on the line 120, as described in block 640 of FIG. 6. The methods for modifying the control input parameters are known by those skilled in the art. The modifications to the control input parameters on the line 120 generally result in a reduction in the model error. This completes the step of performing manufacturing model adjustments described in block 450 of FIG. 4, which completes the step of performing the dynamic sampling process described in block 330 of FIG. 3. Turning back to FIG. 3, when the step of performing the dynamic sampling process is substantially complete, a subsequent manufacturing run of semiconductor wafers is processed. In addition to manufacturing of semiconductor wafers, the principles taught by the present invention can be applied to other manufacturing processes.

The principles taught by the present invention can be implemented in an Advanced Process Control (APC) framework. The APC framework is one platform from which to implement the overlay control strategy taught by the present invention. In some embodiments, the APC framework can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   processing a first plurality of semiconductor wafers based upon at least one control input parameter signal;
   calculating a minimum sampling rate of semiconductor wafers;
   selecting and analyzing wafers from the first plurality of said semiconductor wafers at the calculated sampling rate;
   quantifying the performance of said processing of said first plurality of semiconductor wafers, based upon said analyzed wafers; and
   performing a dynamic sampling process based upon said quantification of the performance of said processing of semiconductor wafers.

2. The method described in claim 1, further comprising processing a second plurality of semiconductor wafers based upon results from said dynamic sampling process.

3. The method described in claim 2, wherein processing semiconductor wafers further comprises performing a photolithography process on said semiconductor wafers.

4. The method described in claim 3, wherein acquiring metrology data from said processed semiconductor wafers further comprises acquiring scatterometry data.

5. The method described in claim 2, wherein processing semiconductor wafers further comprises performing a chemical mechanical polishing process on said semiconductor wafers.

6. The method described in claim 1, wherein calculating a minimum sampling rate further comprises using historical production data to determine said minimum sampling rate.

7. The method described in claim 1, wherein performing a dynamic sampling process further comprises:
   acquiring metrology data from sampling of said processed semiconductor wafers;
   calculating a model error based upon said acquired metrology data;
   calculating a first sampling rate based upon said model error;
   determining whether said model error drifts outside a predetermined range;
   calculating a second sampling rate based upon a determination that said model error drifts outside said predetermined range; and
   performing an adjustment to a manufacturing model based upon a determination that said model error does not drift outside said predetermined range.

8. The method described in claim 7, wherein acquiring metrology data further comprises acquiring metrology data using a metrology tool.

9. The method described in claim 7, wherein calculating a model error further comprises:
   comparing said acquired metrology data to at least one predetermined setpoint;
   calculating a difference between said acquired metrology data and said predetermined setpoint; and
   normalizing said calculated difference.

10. The method described in claim 9, wherein calculating a difference between said acquired metrology data and said predetermined setpoints further comprises calculating a differential data responsive to a difference between a predicted manufacturing behavior and an actual manufacturing behavior.

11. The method described in claim 9, wherein normalizing said calculated difference further comprises dividing said calculated difference by a number of processed semiconductor wafers.

12. The method described in claim 9, wherein normalizing said calculated difference further comprises dividing said calculated difference by a nominal manufacturing value.

13. The method described in claim 7, wherein calculating a second sampling rate based upon a determination that said model error drifts outside said predetermined range further comprises increasing the value of said first sampling rate.

14. The method described in claim 7, wherein performing an adjustment to a manufacturing model based upon a determination that said model error does not drift outside said predetermined range further comprises:
   acquiring metrology data from a manufacturing process that utilizes said second sampling rate;
   correlating said acquired metrology data with a corresponding set of semiconductor wafers;
   sending said correlated metrology data to a manufacturing model; and
   adjusting a manufacturing recipe using said manufacturing model.

15. The method described in claim 14, wherein adjusting a manufacturing recipe using said manufacturing model further comprises modifying a set of control input parameters that controls a processing tool.

16. An apparatus, comprising:
   a computer system;
   a manufacturing model coupled with said computer system, said manufacturing model being capable of generating and modifying at least one control input parameter signal;
   a machine interface coupled with said manufacturing model, said machine interface being capable of receiving process recipes from said manufacturing model;
   a processing tool capable of processing semiconductor wafers and coupled with said machine interface, said first processing tool being capable of receiving at least one control input parameter signal from said machine interface;

a metrology tool coupled with said first processing tool and said second processing tool, said metrology tool being capable of acquiring metrology data;

a metrology data processing unit coupled with said metrology tool, said metrology data processing unit being capable of organizing said acquired metrology data; and a sample rate adjustment unit coupled with said computer system, said sample rate adjustment unit being capable of determining a sampling rate for selecting and sampling processed semiconductor wafers based upon said organized metrology data.

17. The apparatus of claim 16, wherein said computer system is capable of generating modification data for modifying at least one control input parameter.

18. The apparatus of claim 16, wherein said manufacturing model is capable of modifying said control input parameter in response to said modification data.

19. The apparatus of claim 16, wherein said manufacturing model further comprises a model error calculating unit capable of calculating a model error based upon said organized metrology data.

20. The apparatus of claim 16, wherein said metrology tool is a scatterometer.

21. The apparatus of claim 16, wherein said sample-rate adjustment unit further comprises a sampling rate controller capable of modifying a semiconductor wafer sampling rate based upon said organized metrology data.

22. The apparatus of claim 21, wherein said sample-rate adjustment unit further comprises a wafer selection controller coupled with said sampling rate controller, said wafer selection controller being capable of selecting processed semiconductor wafers based upon said sampling rate determined by said sampling rate controller.

23. An apparatus, comprising:

means for processing a first plurality of semiconductor wafers based upon at least one control input parameter signal;

means for calculating a minimum sampling rate of semiconductor wafers;

means for selecting and analyzing devices from the first plurality of said semiconductor wafers at the calculated sampling rate;

means for quantifying the performance of said processing of said first plurality of semiconductor wafers based upon said analyzed devices; and means for performing a dynamic sampling process based upon said quantification of the performance of said processing of semiconductor wafers.

24. A computer readable program storage device encoded with instructions that, when executed by a computer, performs a method, comprising:

processing a first plurality of semiconductor wafers based upon at least one control input parameter signal;

calculating a minimum sampling rate of semiconductor wafers;

selecting and analyzing devices from the first plurality of said semiconductor wafers at the calculated sampling rate;

quantifying the performance of said processing of said first plurality of semiconductor wafers based upon said analyzed devices; and performing a dynamic sampling process based upon said quantification of the performance of said processing of semiconductor wafers.

25. The computer readable program storage device encoded with instructions that, when executed by a computer, performs the method described in claim 24, further comprising processing a second plurality of semiconductor wafers based upon results from said dynamic sampling process.

26. The computer readable program storage device encoded with instructions that, when executed by a computer, performs the method described in claim 25, wherein processing semiconductor wafers further comprises performing a photolithography process on said semiconductor wafers.

27. The computer readable program storage device encoded with instructions that, when executed by a computer, performs the method described in claim 26, wherein acquiring metrology data from said processed semiconductor wafers further comprises acquiring scatterometry data.

28. The computer readable program storage device encoded with instructions that, when executed by a computer, performs the method described in claim 25, wherein processing semiconductor wafers further comprises performing a chemical mechanical polishing process on said semiconductor wafers.

29. The computer readable program storage device encoded with instructions that, when executed by a computer, performs the method described in claim 24, wherein calculating a minimum sampling rate further comprises using historical production data to determine said minimum sampling rate.

30. The computer readable program storage device encoded with instructions that, when executed by a computer, performs the method described in claim 24, wherein performing a dynamic sampling process further comprises:

acquiring metrology data from sampling of said processed semiconductor wafers;

calculating a model error based upon said acquired metrology data;

calculating a first sampling rate based upon said model error;

determining whether said model error drifts outside a predetermined range;

calculating a second sampling rate based upon a determination that said model error drifts outside said predetermined range; and performing an adjustment to a manufacturing model based upon a determination that said model error does not drift outside said predetermined range.

31. The computer readable program storage device encoded with instructions that, when executed by a computer, performs the method described in claim 30, wherein acquiring metrology data further comprises acquiring metrology data using a metrology tool.

32. The computer readable program storage device encoded with instructions that, when executed by a computer, performs the method described in claim 30, wherein calculating a model error further comprises:

comparing said acquired metrology data to at least one predetermined setpoint;

calculating a difference between said acquired metrology data to said predetermined setpoint; and normalizing said calculated difference.

33. The computer readable program storage device encoded with instructions that, when executed by a computer, performs the method described in claim 32, wherein calculating a difference between said acquired metrology data and said predetermined setpoints further comprises calculating a differential data responsive to a difference between a predicted manufacturing behavior and an actual manufacturing behavior.

34. The computer readable program storage device encoded with instructions that, when executed by a computer, performs the method described in claim 32, wherein normalizing said calculated difference further comprises dividing said calculated difference by a number of processed semiconductor wafers.

35. The computer readable program storage device encoded with instructions that, when executed by a computer, performs the method described in claim 32, wherein normalizing said calculated difference further comprises dividing said calculated difference by a nominal manufacturing value.

36. The computer readable program storage device encoded with instructions that, when executed by a computer, performs the method described in claim 30, wherein calculating a second sampling rate based upon a determination that said model error drifts outside said predetermined range further comprises increasing the value of said first sampling rate.

37. The computer readable program storage device encoded with instructions that, when executed by a computer, performs the method described in claim 30, wherein performing an adjustment to a manufacturing model based upon a determination that said model error does not drift outside said predetermined range further comprises:

acquiring metrology data from a manufacturing process that utilizes said second sampling rate;

correlating said acquired metrology data with a corresponding set of semiconductor wafers;

sending said correlated metrology data to a manufacturing model; and adjusting a manufacturing recipe using said manufacturing model.

38. The computer readable program storage device encoded with instructions that, when executed by a computer, performs the method described in claim 37, wherein adjusting a manufacturing recipe using said manufacturing model further comprises modifying a set of control input parameters that controls a processing tool.

* * * * *